United States Patent [19]

Berney

[11] 4,314,146

[45] Feb. 2, 1982

[54] ANALOG DISPLAY DEVICE

[75] Inventor: Jean-Claude Berney, Chemin du Bois de Menton, 1066 Epalinges, Switzerland

[73] Assignee: Jean-Claude Berney, Epalinges, Switzerland

[21] Appl. No.: 93,925

[22] Filed: Nov. 13, 1979

[30] Foreign Application Priority Data

Nov. 21, 1978 [CH] Switzerland .................. 11903/78

[51] Int. Cl.³ .............................................. G01R 1/30
[52] U.S. Cl. ............................. 235/92 EA; 235/92 B; 235/92 K; 318/490; 318/696; 324/100; 324/139
[58] Field of Search ............. 235/92 EA, 92 K, 92 B, 235/92 MT, 92 EL, 92 CC; 324/100, 115, 139; 318/490, 696; 346/65, 117 R, 146, 139 C

[56] References Cited

U.S. PATENT DOCUMENTS

| | | | |
|---|---|---|---|
| 3,249,742 | 5/1966 | Buchsbaum | 235/92 K |
| 3,287,963 | 11/1966 | Stanya et al. | 235/92 EA |
| 3,394,382 | 7/1968 | Fuller | 235/92 B |
| 3,770,945 | 11/1973 | Dlugos et al. | 235/92 EA |
| 3,886,562 | 5/1975 | Atzinger et al. | 324/100 |
| 3,887,796 | 6/1975 | Trousdale et al. | 318/696 |
| 4,125,801 | 11/1978 | Leenhouts | 318/696 |

FOREIGN PATENT DOCUMENTS 1918748 10/1970 Fed. Rep. of Germany .

OTHER PUBLICATIONS

"Presettable Digital Control of Stepper Motor", *Med. & Biol. Eng. & Comput.*, vol.15, No. 6, Nov. 1977, pp. 694–697.

*Primary Examiner*—Leo H. Boudreau
*Attorney, Agent, or Firm*—Wender, Murase & White

[57] ABSTRACT

The analog display device comprises at least one needle driven through a gear wheel by a stepping motor, a control circuit for the motor, bidirectional counter locked with the position of the needle on a dial, the logic states of the outputs of the counter being representative of the position of the needle on the dial and a comparator for the informations delivered by the counter and the informations corresponding to the value of the function to display, the comparator acting at least indirectly on the control circuit and on the counter so that the position of the needle is representative of the value of the function to display. The device does not require any digital-analog converter nor galvanometer and it allows for, example, to display simultaneously with at least two needles the value of at least two different functions, to make changes of scale, and so on. The device may also be combined with another type of analog or digital display.

17 Claims, 4 Drawing Figures

ANALOG DISPLAY DEVICE

BACKGROUND OF THE INVENTION

The present invention relates to an analog display device of the value of at least one function represented by an information composed of a certain number of logic states. There exists already very numerous analog display devices of the value of a function by means of a needle or an index co-operating with a graduated dial. In certain cases, the displacement of the needle is in a direct relation with the function to be measured. For example, in the anemometers and the bathymeters, the needle is directly set into motion by a transducer sensitive to the pressure and in the galvanometers, the needle is directly displaced by a transducer sensitive to the electric current. However, in numerous applications, the displacement of the needle is an indirect relation of the function to be measured. For example, in very numerous electrical measuring instruments, the function is at first converted in an electric current having a value proportional to the value of the function and then displayed by means of a galvanometer. Such a method, although very widely utilized, has many drawbacks. On the one hand, the proper error of the galvanometer is added to the measuring error and, on the other hand, the galvanometers are very often sensitive to the shocks and vibrations.

By another way, and more and more often, the measuring and control instruments make use of the digital technique wherein the value of the function is represented by an information composed of a succession of logic states which may be displayed directly by means of digital displays. For this reason, and also because they require analog-digital converters which are relatively expensive, the analog displays are more and more often abandoned. However, there still exist numerous applications where the analog display is superior in comparison with the digital display. This is the case when one desires a rapid appreciation of the value of the function.

As an example, in the motor cars, the digital displays are not well accepted by the drivers. It is already known however, that in this domain, the microprocessor will soon be introduced. The microprocessor shall centralize all the measurements required for the good running of the car and the results of these measurements shall be expressed in digital form. However, from the point of view of the driver, it would still be desirable that these results be displayed in analog form.

SUMMARY OF THE INVENTION

The object of the present invention is an analog display device of the value of a function represented by an information composed of a succession of logic states, the device requiring no digital-analog converter nor galvanometer.

The device according to the invention comprises at least one stepping motor driving at least one needle co-operating with a graduated dial, a control circuit for delivering driving pulses to the stepping motor, a counter having a counting capacity corresponding to the number of steps required for the needle to reach the end of the scale on the dial, first means for locking the contents of said counter in relation with the value indicated by said needle, in a determined position of said needle, and second means for setting the counter in a state corresponding to the value of the function to be displayed, said second means being connected to said counter and to said control circuit so that the stepping motor receives a number of driving pulses directly related to the number of clock pulses delivered by said first means to the input of said counter, in order for said needle to remain locked with said counter and that is position on the dial is representative of the contents of said counter and consequently of the value to be displayed.

The present invention will be described further, by way of example, with reference to the accompanying drawings.

DESCRIPTION OF THE PREFERRED EMBODIMENT

Figure 1:
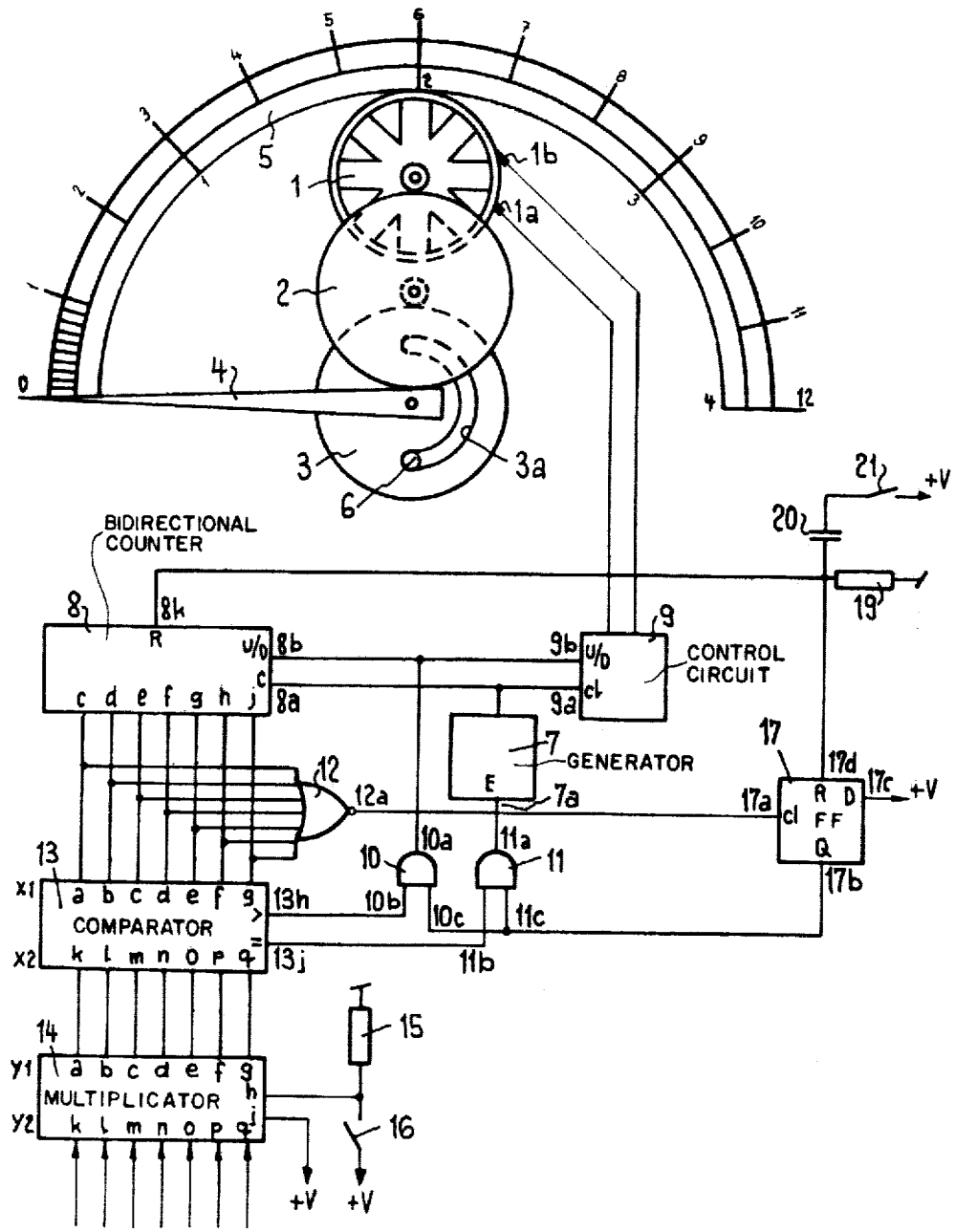
FIG. 1 is a diagram of a device according to the present invention, comprising a bidirectional motor.

In FIG. 1, the bidirectional stepping motor 1 drives through a wheel 2, the wheel 3 which supports on its axis the needle 4 co-operating with the graduated dial 5. The wheel 3 has a semi-circular opening 3a which is traversed by the stop 6. This stop 6 limits the displacement of the needle to the position 0 of the dial on one side and to about the position 13 on the other side. The gear ratios have been choosen so that the needle rotates of 180 degrees for 120 steps of the motor.

The electronic circuit comprises a generator 7 delivering pulses of a frequency of about 100 Hz to the clock input 8a of a binary bidirectional counter 8 having a counting capacity of $2^7$ and to the input 9a of the control circuit 9 for the stepping motor. The circuit 9 is arranged to deliver for each pulse present on its input 9a a driving pulse having the right form and polarity to the inputs 1a and 1b of the bidirectional stepping motor in order to cause the motion of this motor in the desired direction.

To this end, the control circuit has an up-down control input 9b (U/D) connected to the up-down control input 8b (U/D) of the counter 8 and to the output 10a of an AND gate 10. The generator 7 comprises also an enable input 7a connected to the output 11a of an AND gate 11. This enable input permits to interrupt the pulses delivered by the generator.

The counter 8 has seven outputs 8c and 8j corresponding to the seven binary stages of which it is comprised. The logic states on these outputs represent an information corresponding to the contents of the counter 8. The seven outputs 8c to 8j are connected respectively to the seven inputs 13a to 13g of a comparator 13 of seven bits. The output inequality 13h (x1<x2) of this comparator is connected to the input 10b of the AND gate 10 and the output equality 13j (x1=x2) of the comparator is connected to the input 11b of the AND gate 11.

The second inputs 13k to 13g of the comparator 13 are connected to the outputs 14a to 14g of a 2 bits multiplicator 14 receiving on its inputs 14k to 14q an information of seven bits corresponding to the value of the information to display. The input y0 (14j) is connected to the positive pole of the supply and the input y1 (14h) to a resistor 15 connected between earth and one pole of the push-button 16, the other pole of which being connected to the positive pole of the supply. y0 and y1 determine the multiplication factor. Normally, y0 is at the logic state 1 and y1 at the logic state 0 which correspond to the binary number 01. The information at the input of the multiplicator 14 is multiplied by the factor 1.

If the push-button 16 is depressed, y1 changes to the logic state 1 so that the binary number changes to 11. The information at the input of the multiplicator 14 is then multiplied by the factor 3.

The output 12a of the NOR gate 12 is connected to the clock input 17a of a D-type flip-flop 17, FF17, the output Q, 17b of which is connected to the inputs 10c and 11c of the AND gates 10 and 11, while its input D, 17c, is connected to the positive pole of the supply. The reset input R, 17d of the flip-flop FF17 is connected to the reset input 8k of the counter 8 and to the resistor 19 connected to the negative pole of the supply. This reset input 8k is also connected through a capacitor 20 to a contact 21 connected to the positive pole of the supply.

The principle of action of the circuit is the following:

Resetting

By depressing the push-button 21, a positive pulse of voltage is transmitted through the capacitor 20 on the resistor 19 and to the reset inputs 17d and 8k of the flip-flop FF17 and the counter 8 respectively. The counter 8 is resetted and the output 12a of the NOR gate 12 changes to the logic state 1. The output Q of FF17 changes to the logic state 0 as well as the outputs 10a and 11a of the AND gates 10 and 11 and the up-down control inputs 8b and 9b of the counter 8 and the control circuit 9, which correspond to the backward motion of the motor 1. The enable input 7a of the generator 7 is also at 0 and this generator delivers pulses to the inputs 8a and 9a of the counter 8 and the control circuit 9 respectively. The counter 8 begins to count down and the stepping motor turns backward. When the counter 8 reaches again 0, that is after the counter and the motor have received $2^7 = 128$ pulses, the output 12a of gate 12 changes to the logic state 1 so that the flip-flop FF17 switches over, its output Q changing to the logic state 1 and, in consequence, also the inputs 10c and 11c of the gates 10 and 11.

During these 128 driving pulses (backward), the wheel 3 has obligatorily abuted against the stop 6 and the needle 4 is therefore blocked on the position 0 of the dial 5. This manipulation has therefore permitted the resetting of the needle 4 as well as the one of the counter 8 which from now on are locked together. In this example, the resetting operation is released by a manual action on a push-button. It could also be done automatically, for example, each time the circuits are switched on or each time the information at the input becomes zero, and so on. The locking between the position of the needle 4 and the contents of the counter 8 may also be done by a contact which closes when the needle is in a determined position of the dial or by any other similar position detection system.

Normal working

After the above mentioned resetting operation, the counter 8 and the control circuit 9 receive on their respective inputs 8a and 9a the same number of pulses. In this manner, the needle advances of one step each time the counter is incremented of one step, so that the position of the needle and the contents of the counter still remain locked together, after this resetting operation. Therefore, the position of the needle on the dial corresponds to the contents of the counter 8 represented by the succesion of the logic states at its outputs 8c to 8j. Consequently, it is to be seen that the combination of a needle and a graduated dial allow to display in analog form the logic information delivered by the counter 8. However, and except in the case where the counter 8 has a proper counting function (pulse adder, measuring circuit related to the time, and so on.), the display of its contents is not particularly intersecting. It would be therefore desirable to be able to display any logic information whatever its source may be. One way of solving this problem consists in the introduction of a comparator and means acting simultaneously on the counter and the control circuit for setting the contents of the counter to the same value than the one of the information to display, so that the position of the needle on the dial corresponds to the value of the information to display.

After the resetting operation, the counter 8 is at the logic state 0 and the inputs 10c and 11c are at 1. Therefore, the gates 10 and 11 deliver on their outputs 10a and 11a the logic states of the outputs 13h and 13j of the comparator 13. If the contact 16 is open, the states of the inputs 14k to 14q, corresponding to the input information representing the value of the function to display, are transmitted directly to the outputs 14a and 14g of the multiplicator 14 and to the inputs 13k to 13q of the comparator 13.

Let us assume that the value to display is 67 (represented by the binary input information 1000011). The counter 8 being at 0, the binary information corresponding to its contents and which is present on the inputs 13a and 13g of the comparator 13 is 0000000, which is smaller than 67. The output 13h of the comparator and the inputs 8b and 9b of the counter and the control circuit respectively are at 1, which controls the counter 8 and the control circuit 9 in the forward direction. The output equality 13j and the input 7a of the generator are at 0. The generator is working. The counter 8 and the stepping motor function synchronously in the forward direction. The contents of the counter, expressed in the decimal system, remains therefore equal to the position indicated by the needle on the external scale of the dial 5. As soon as the counter 8 and the needle have reached together the value 67, the equality output 13j of the comparator changes to 1 while the output inequality changes to 0. The input 7a of the generator changes to 1 which blocks this generator. Therefore, the counter 8 and the needle 4 are also blocked on the contents, respectively the position 67 corresponding to the value of the function to display.

Let us assume now that the value to display changes to 52 (binary information 0110100). The contents of the counter 8 being still 67, which is greater than 52, the output 13h of the comparator remains at 0, like the inputs 8b and 9b of the counter 8 and the control circuit 9, so that the counter 8 and the control circuit 9 are controlled in the backward direction. The equality disappears and the output 13j of the comparator changes to 0 like the input 7a of the generator which is again working. The stepping motor and the counter 8 function synchronously in the backward direction until the counter 8 and the needle 4 reach together the value 52. The equality which blocks the counter 8 and the needle 4 on the position 52 corresponding to the value of the function to display.

The circuit is arranged in order to display on the external scale of the dial the value corresponding to the information present on the inputs 13k to 13q of the comparator. In this particular case (16 is open), this information is the same than that which is present at the inputs 14k and 14q of the multiplicator 14. If the push-button 16 is closed, the multiplicator 14 multiplies by three the information at the input. If, for example, the information at the input is 21 (binary information 0010101), the information present at the inputs 13k to 13q of the comparator will be $21 \times 3 = 63$ (binary information 0111111) and the needle reaches the position 63 on the external scale corresponding to the position 21 on the internal scale of the dial. In this manner it is very easy to adapt the indication to various scales of the dial by multiplying or dividing either the information at the input corresponding to the value to display or the information delivered by the counter 8 corresponding to the position of the needle on the dial. It is also possible to incorporate to the device a calculating circuit for subtracting a predetermined value from the value corresponding to the information in order to display directly the difference between the value of the information at the input and that predetermined value.

In FIG. 1 have been represented only the circuits which are necessary for the understanding of the device. However, it is clear that measuring or control circuits may be added for realizing for example a multimeter. In other cases, all or part of the circuits represented may be incorporated within an instrument at a remote location and electrically connected to the display device. It is also possible, for example in the case of an utilization with microprocessors where the informations are delivered sequentially, to incorporate input registers for converting these sequential informations in parallel informations.

It is also possible to change at will the angular displacement by steps of the needle and the distribution of the graduation on 180 degrees by acting on the gear train and on the capacity of the counter 8 respectively. It is further possible by means of another system of stop that shall be described later on, to realize multiturn displays utilizing a graduation on 360 degrees. In this case it is possible to add a supplementary wheel driving a needle for displaying the number of turns. These multiturn displays allow to increase the reading accuracy but at the cost of the rapidity. Indeed, if a display of 10 turns of 100 steps exists and if the speed of the motor is of 100 steps per second, it will take 10 seconds to pass from one end to the other end of this display.

Figure 2:
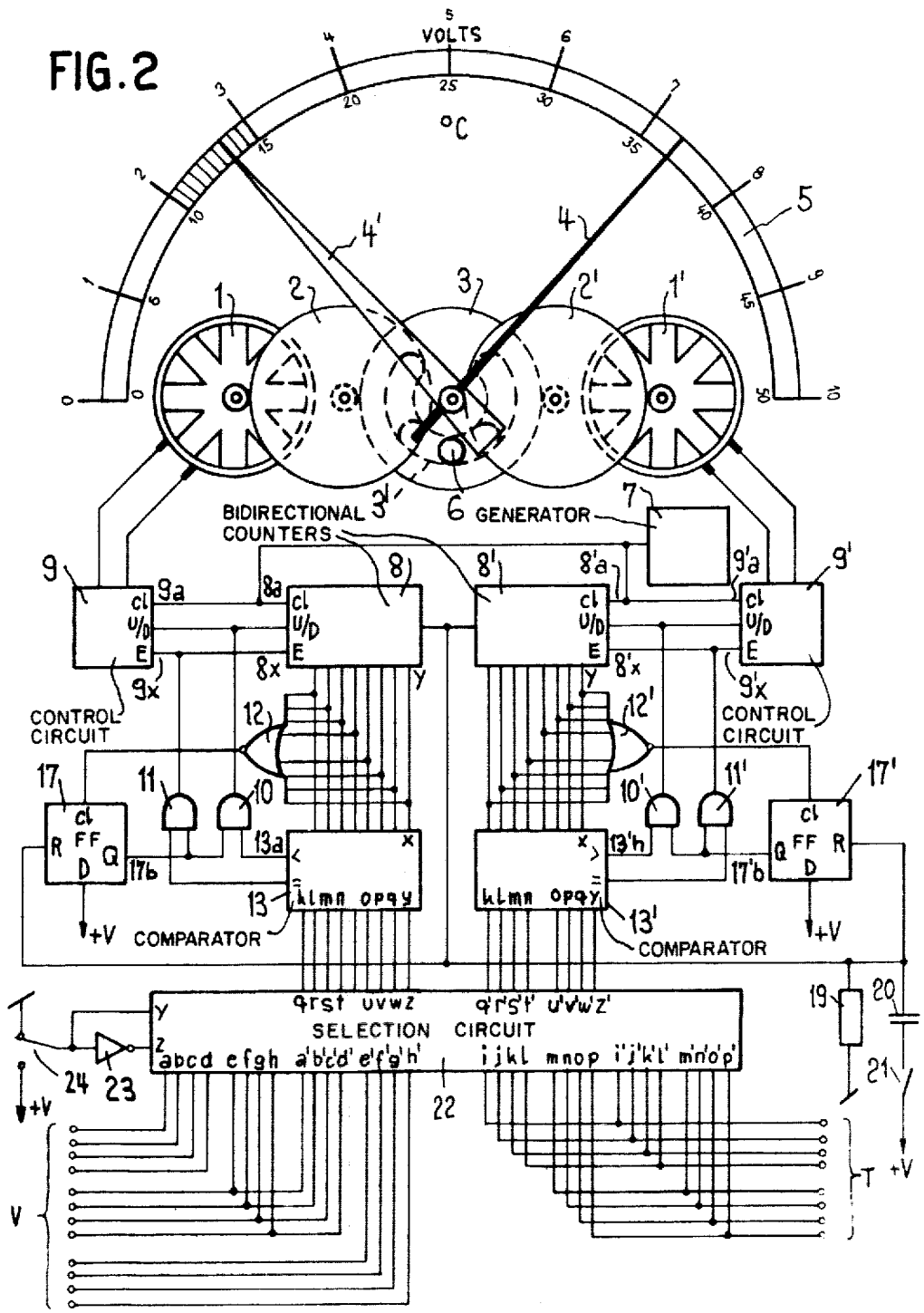
FIG. 2 is a diagram of a device according to the present invention, comprising two bidirectional motors.

A simple means to increase the speed consists in utilizing a double device comprising two stepping motors. FIG. 2 shows an embodiment of such a device. This device comprises practically two times the device of FIG. 1. On the one hand, the bidirectional motor 1 drives, through the wheel 2, the wheel 3 which supports on its axis the needle 4 co-operating with the external scale of the dial 5. On the other hand, the bidirectional motor 1' drives through the wheel 2', the wheel 3' which supports on its axis the needle 4' co-operating with the internal scale of th dial 5. The wheels 3 and 3' carry each a semi-circular opening traversed by the stop 6. This stop blocks the needle 4 and 4' in the position 0 of the dial when they move in the backward direction. The gear ratios may be choosen so that the needles 4 and 4' effect a displacement of 180 degrees for 120 steps of their respective motors. This is an interesting particular case. Because the two parts of the display are independent, beside the fact that the needles are mounted coaxially, it is possible to display simultaneously different functions by means of each needle and to choose gear ratios, counting capacities and different graduations of the dial for each of these parts. In FIG. 2, however, the two systems are symmetrical and there is to be fined again, like in FIG. 1, the counter 8, the control circuit 9, the AND gates 10 and 11, the NOR gate 12, the comparator 13 and the flip-flop FF17 for the positioning of the needle 4, and the counter 8', the control circuit 9', the AND gates 10' and 11', the NOR gate 12', the comparator 13' and the flip-flop FF17' for the positioning of the needle 4'. The principle of action of these circuits has already been described in relation with the description of FIG. 1, beside of the following points.

The circuit of FIG. 2 comprises a single generator permanently delivering pulses on the clock inputs 8a and 9a, respectively 8'a and 9'a of the circuits 8 and 9, respectively 8' and 9'. The control circuits 9 and 9' and the counters 8 and 8' have their proper enable inputs 9x, 9'x, 8'x, respectively connected to the outputs of the gates 11 and 11'.

The counters 8 and 8' are comprised each of two BCD-type decades and they have a counting capacity of 100. They comprise therefore eight binary stages each with an additional output 8y, respectively 8'y.

Consequently, the comparators 13 and 13' are of the eight bit type and have two additional inputs 13x and 13y, respectively 13'x and 13'y.

In the circuit of FIG .2, the multiplicator 14 of FIG. 1 has been eliminated. On the other hand, FIG. 2 includes a selection circuit 22 of AND-OR controlled on its inputs 22y and 22z (inverted by the inverter 23), by the switch 24 connected either to the negative pole of the supply or to the positive pole of the supply.

In one of the positions of the switch, the circuit 22 selects the information V on its inputs a to h and a' to h' and delivers it at its outputs q to x, respectively q' to x'.

In the other position of the switch, the circuit 22 selects on its outputs q to x, respectively q' to x' the information T on its inputs i to p, respectively i' to p'. The outputs q to x of the selection circuit 22 are connected to the inputs k to y of the comparator 13. Therefore, the value corresponding to the logic states of these outputs will be displayed by the needle 4.

The outputs q' to x' of the selection circuit 22 are connected to the inputs k to y of the comparator 13'. Therefore, the value corresponding to the logic states of these outputs will be displayed by the needle 4'.

In the first position of the switch, it is therefore the information V of 12 bits corresponding to the value of a voltage which is displayed.

The first 8 bits of this information are displayed by the needle 4 and the last 8 bits by the needle 4'. The 4 central bits are therefore displayed by the two needles. These 4 central bits are the most significant bits of the value displayed by the needle 4 and the least significant bits of the value displayed by the needle 4'. The carrying forward of part of the information to be displayed by a needle to the other needle allow to display the information about in the same manner as is done by the classical analog displays. Thus, in FIG. 2, the value of the voltage to display is 2.73 volts. The needle 4' indicates 2.7 instead of 2.0 if the carrying forward would not have been done, and the needle 4 indicates 7.3. The value which is displayed is 2.73. Due to the addition of a separate needle driven by a separate stepping motor, the reading accuracy is increased ten times without affecting the displaying speed.

It is still possible to increase the reading accuracy by adding a third needle and a third motor, and so on.

It is to recognize that the display described in FIG. 2, comprising two needles, corresponds to a digital display of 3 digits. Now, very often, the measuring instruments utilize displays of 3.5 digits, with a capacity of 1999. A compatibel analog display would necessitate a graduation of 20. It is also possible, when the value to be displayed is greater than 999 to display the overshoot with a LED. Another possibility is to render the needle 4' oscillating by acting on the least significant bits of the information displayed by this needle, so as to attract the attention of the user.

In the second position of the switch 24, it is the information of 8 bits in T, corresponding e.g. to the value of a temperature, which is displayed. The eight bits of the information are displayed by the needle 4 as well as by the needle 4'. The two needles are therefore superposed and are visualized like a single needle. They co-operate in that case with the internal scale of the dial 5. Thus, when the accuracy given by the second needle is not required, it is possible to superpose this needle on the first needle, which permits to avoid ay confusion in the reading.

The utilization of selection means makes possible to successively display, if necessary, functions of different nature, on different scales of the dial. The embodiment of FIG. 2 may have a drawback. If the value of the voltage to display varies between e.g. 6.95 and 7.05, the needle 4 will oscillate between 9.5 and 0.5, which is very undesirable.

Figure 3:
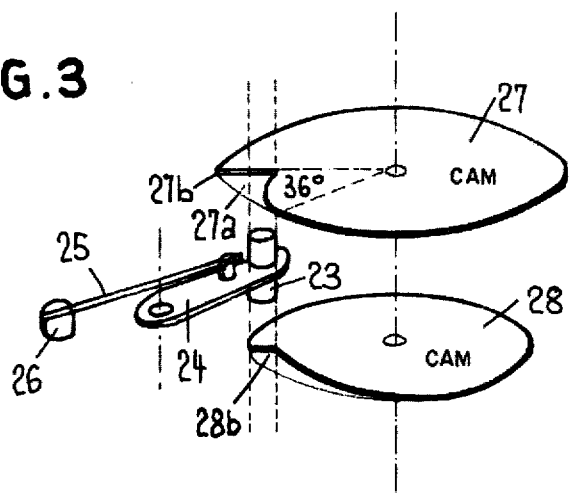
FIG. 3 is a schematic representation of a unidirectional stop system.

A simple means to obviate this drawback consists in the utilization of a graduation on 360 degrees, possibility already mentioned above, and a stop system permitting the needle 4 to pass the 0 of the graduation in both directions under certain circumstances. FIG. 3 illustrates schematically such a stop systems.

The stop 23 is fixed on an articulating lever 24 pushed by the spring 25 mounted on a slotted pin 26. The stop 23 co-operate with two cams, 27 and 28. The first cam, 27, is fixed on the wheel 3' (see FIG. 2) and the second cam, 28, is fixed on the wheel 3 of FIG. 2.

The form of the cam 27 is such that when the cam turns of 36 degrees, which corresponds to a displacement of the needle 4' between the 0 and the 1 of the graduation, the stop is entirely disengaged from the cam 28. Therefore, the wheel 3 and the needle 4 may move freely in both directions.

To set the needles to 0, it is sufficient to let them turn backward. When the needle 4' arrives near 0, the stop enters in the clearance 27a and comes then to abut against the plane 27b, which blocks the needle 4' in the position 0. The stop has then entered sufficiently the clearance 27a to come into contact with the cam 28. When the needle 4 arrives at 0, the stop comes into contact with the plane 28b which blocks the needle 4 in the position 0. It is to be seen that the system is unidirectional and is only working when the needles move backward.

Figure 4:
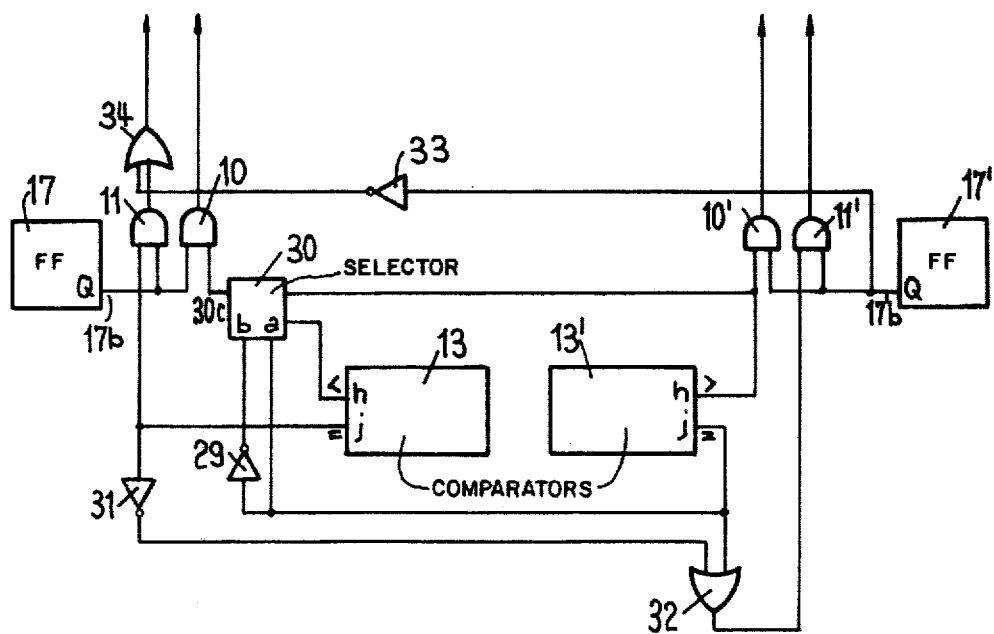
FIG. 4 is a diagram of a calculating circuit acting on the direction of rotation of the needle.

In order to obtain the desired effect, i.e. the passage from 0.5 through 0 to 9.5, going backward, instead of going forward, it is necessary to act on the control circuit of the running direction. FIG. 4 shows as an example the alterations to make to the diagram of FIG. 2 to realize this function. One recognize the comparators 13 and 13' with their outputs inequality 13h and 13'h and the outputs equality 13j and 13'j, the flip-flops FF17 and FF17' and the AND gates 10, 11, 10', and 11'. The outputs 13h and 13'h are connected to an AND-OR selector 30 which is controlled on its inputs a and b (inverted by the inverter 29) by the output equality 13'j of the comparator 13' in such a way that when there is an inequality (13'j at 0) it is the state of the output 13'h which is selected on the output 30c of the selector 30. On the contrary, in case of equality (13'j at 1), it is the state of the output 13h which is selected on 30c. The output 30c is connected to the input of the AND gate 10 which controls the direction of running of the needle 4. The output equality 13j, inverted by the inverter 31, is connected to the input of an OR gate 32 receiving on its second input the signal of the output equality 13'j. The output of the gate 32 is connected to an input of gate 11' which controls the stop of the needle 4'.

Thus, in the case of inequality on 13, the needle 4' remains blocked until the needle 4 is in position and that the equality reappears on the output 13j. If we consider again the preceding example, that is the passage from 7.05 to 6.95, we have the following situation:

The comparator 13' compares 70 to 69, which means inequality and therefore 13'j is at 0. The comparator 13 compares 05 to 95, which means inequality and therefore 13j is at 0.70 being greater than 69, 13'h is at 0.05 being smaller than 95, 13h is at 1.

Because 13'j is at 0, it is the state of 13'h (in this case 0) which is selected to the output of the selector 30. The needle 4 moves therefore backward and passes directly from 05 to 95, which shows that the desired effect has been obtained.

The output Q of FF17' is inverted by the amplifier 33 the output of which is going to one input of an OR gate 34. The other input of 34 is connected to the output of gate 11 and the output of gate 34 is connected to the enable inputs of the counter 8 and the control circuit 9. At the moment of the resetting, the flip-flop FF17' switches to 0 and the output of the amplifier 33 is at 1. The output of the gate 34 is at 1, which blocks the needle 4. This needle 4 remains blocked until the resetting of the other needle 4' has taken place. The needle 4' is then at 0 and the stop is in place for the resetting of the needle 4.

It is visible that this display device, like the digital displays, may be utilized to display a very great number of functions and parameters, in fact every functions and parameters which may be converted in the form of an information represented by a succession of logic states. However, this is practically the case for all physical parameters, such as force, pressure, length, time, duration, weight, volume, voltage, current, resistance, and so on.

It is also possible to utilize the device for the display of symbols, these symbols occupying determined positions on the dial which are represented by information of corresponding values. It is also possible to combine this type of display with other display systems. For example, it is possible without any problem to incorporate to the display according to the present invention a digital display controlled by the same informations at the input. This permits a rapid appreciation of the value of the function by means of the needle and a precise reading of the value of this function by means of the digital display.

Another possibility consists to incorporate the display according to the present invention in another system of analog displays with needles, which is relatively easy due to the fact that the needles are coaxially mounted and driven by separate gear wheels (like in FIG. 2). As an example, in a car, it would be possible to add to the deck watch a third needle to display the turns per minute of the motor, represented by an information delivered by a measuring circuit.

What I claim is:

1. Analog display device of the value of at least one function represented by an information composed of a certain number of logic states, said device comprising at least one stepping motor driving at least one needle co-operating with a graduated dial, a control circuit for delivering driving pulses to the stepping motor, a counter having a counting capacity corresponding to the number of steps required for the needle to reach the end of the scale on the dial, first means for locking the contents of said counter in relation with the value indicated by said needle, in a determined position of said needle, and second means for setting the counter in a state corresponding to the value of the function to be displayed, said second means being connected to said counter and to said control circuit so that the stepping motor receives a number of driving pulses directly related to the number of clock pulses delivered by said first means to the input of said counter, in order for said needle to remain locked with said counter and that its position on the dial is representative of the contents of said counter and consequently of the value to be displayed.

2. Device according to claim 1, wherein said second means comprise logic comparison means receiving at least indirectly on their first inputs the information corresponding to the contents of said counter and receiving at least indirectly on their second inuts the information corresponding to the value of the function to be displayed, said comparison means being capable to deliver an equality signal in the absence of which the counter receives clock pulses from said first means until the contents of said counter corresponds to the value of the function to be displayed, which restore the equality between the information on the first and second inputs of said comparison means.

3. Device according to claim 1, wherein the stepping motor and the counter are of bidirectional type, the counter and the control circuit of the stepping motor receiving the same control signal of the counting direction, so that the value indicated by said needle remains locked with the contents of said counter.

4. Device according to claim 1, wherein said first means for locking the contents of the counter and the value indicated by said needle are a stop permitting to block the needle in a determined position on the dial and means acting on the control circuit for the stepping motor in order to cause a displacement of the needle at least sufficient for bringing said needle in said determined position on the dial.

5. Device according to claim 4, wherein said needle may rotate on more than 360 degrees, said stop being mounted on a spring and arranged for blocking the needle in said dertermined position only when said needle rotates in a well determined direrction.

6. Device according to claim 2, comprising two stepping motors driving at least two needles co-operating with a graduated dial, two counters and two comparison means, said counters and said comparison means being arranged for permitting a simultaneous display of the values of at least two different functions.

7. Device according to claim 2, wherein said comparison means comprise selection means for selecting and successively displaying the values of several functions.

8. Device according to claim 6 or 7, comprising two stepping motors, wherein said selection means are arranged for selecting and displaying the same value of a function, the two needles being superposed and being visualized as a single needle.

9. Device according to claim 2, wherein said comparison means comprise arithmetic circuits for multiplying by a determined factor the informations corresponding to the value of the function to be displayed for driving the needle into a position corresponding to a particular scale of the dial.

10. Device according to claim 1, wherein the dial has several graduations corresponding to different scales of the function to be displayed.

11. Device according to claim 1, wherein the dial has several graduations corresponding to different functions to be displayed.

12. Device according to claim 1, comprising two stepping motors and two needles, wherein said needles are coaxially mounted.

13. Device according to claim 1, comprising two stepping motor and two needles, wherein the two needles are utilized for displaying the same function, one of the needles displaying the value corresponding to the most significant bits of the information corresponding to the value of the function, the other needle displaying the value corresponding to the least significant bits of said information.

14. Device according to claim 1, comprising two stepping motor and two needles, wherein the most significant bits of the part of the information displayed by the second needle are carried over and utilized as the least significant bits of the part of the information displayed by the first needle.

15. Device according to claim 1, wherein said device comprises calculating means acting on the direction of counting of said counter and on the direction of motion of said stepping motor, so that the needle reaches by the shortest way the new position corresponding to a new value of the function.

16. Device according to claim 1, wherein the needle is mounted coaxially with the needles of another analog display system.

17. Device according to claim 1, comprising a digital display for simultaneously displaying the value of the function in the digital and analog form.

* * * * *